United States Patent
Kondo et al.

(10) Patent No.: US 6,793,762 B1
(45) Date of Patent: Sep. 21, 2004

(54) METHOD OF USING A PRESSURE SENSITIVE ADHESIVE SHEET

(75) Inventors: Takeshi Kondo, Urawa (JP); Kazuhiro Takahashi, Kawaguchi (JP); Yoshihisa Mineura, Tokyo (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 09/322,333

(22) Filed: May 28, 1999

(30) Foreign Application Priority Data

Jun. 2, 1998 (JP) .......................................... 10/152835

(51) Int. Cl.$^7$ ............................ C09J 7/02; H01L 21/304
(52) U.S. Cl. ...................... 156/297; 428/343; 428/40.1; 156/308.2
(58) Field of Search .............................. 428/343, 40.1; 156/297, 308.2

(56) References Cited

U.S. PATENT DOCUMENTS 4,756,968 A  7/1988  Ebe et al. .................... 428/343

FOREIGN PATENT DOCUMENTS

| DE | 1594140 | 4/1963 |
| EP | 0252739 | 10/1993 |
| EP | 0798355 | 10/1997 |
| EP | 0622833 | 3/1999 |
| GB | 13044023 | 9/1966 |
| JP | 63296222 | 12/1988 |
| JP | 01056112 | 1/1989 |
| JP | 05077284 | 4/1993 |
| JP | 06101455 | 12/1994 |
| JP | 07135189 | 3/1995 |
| JP | 10-189504 A | 7/1998 |
| JP | 11-016863 A | 1/1999 |

OTHER PUBLICATIONS

JP 11–016863 English Translation with Accompanying English Abstract, Jan. 22, 1999.*
JP 10–189504 English Translation with Accompanying English Abstract, Jul. 21, 1998.*
JP 63 296222 Abstract, Dec. 2, 1988, Derwent Database WPI, Section Ch, Week 198903.

* cited by examiner

Primary Examiner—Daniel Zirker
(74) Attorney, Agent, or Firm—Webb Ziesenheim Logsdon Orkin & Hanson, P.C.

(57) ABSTRACT

The invention is concerned with a pressure sensitive adhesive sheet comprising a substrate and, superimposed thereon, a pressure sensitive adhesive layer, said substrate exhibiting a maximum value of dynamic viscoelasticity tan δ of at least 0.5 at a temperature ranging from −5 to 80° C. At the time of working of the back of an adherend having a surface whose irregular height differences are large, this pressure sensitive adhesive sheet is preferably stuck to the adherend surface to thereby protect it during the working.

4 Claims, No Drawings

METHOD OF USING A PRESSURE SENSITIVE ADHESIVE SHEET

FIELD OF THE INVENTION

The present invention relates to a pressure sensitive adhesive sheet. More particularly, the present invention relates to a pressure sensitive adhesive sheet which, at the time of working of the back of an adherend having a surface whose irregular height differences are large, is preferably stuck to the adherend surface to thereby protect it during the working. The invention also relates to a method of use thereof.

BACKGROUND OF THE INVENTION

In the step of grinding the back of a semiconductor wafer, the surface thereof having electrical circuits formed thereon is protected by a pressure sensitive adhesive sheet. The height differences of customary circuits attributed to electrode elements have ranged from about 5 to 20 µm. For the wafer having these customary circuits formed thereon, the conventional surface protective sheets can fully protect the circuits without the occurrence of circuit breakage or wafer cracking and thus have been satisfactory.

However, in recent years, the method of mounting IC chips is being diversified. For example, the packaging method in which an IC chip circuit surface is arranged down has been developed. In this packaging method, electrode elements protrude from the circuit surface and the height differences thereof are 30 µm or more, occasionally greater than 100 µm.

When the grinding of the back of the wafer having such protrudent electrode elements formed thereon is carried out while protecting the surface with the conventional surface protective sheet, it has been encountered that the back is deeply ground at portions corresponding the protrudent elements to thereby cause depressions (dimples) to occur on the back of the wafer. Further, it has been encountered that dimple portions crack resulting in the breakage of the wafer.

A similar problem is encountered with respect to ink (bad mark) provided for the marking of failure circuits after the inspection of the wafer circuits.

Protrudent portions formed on the surface of semiconductor wafers like those mentioned above are referred to bumps. For the semiconductor wafers having large bumps, measures have been taken, which include, for example, decreasing the hardness of the substrate film of the surface protective sheet and increasing the thickness of the pressure sensitive adhesive sheet. These measures, however, have been unsatisfactory, and the above problems have not yet been resolved.

The present invention has been made in view of the above state of the prior art. It is an object of the present invention to provide a pressure sensitive adhesive sheet which, at the time of working of the back of an adherend having a surface whose irregular height differences are large, is preferably stuck to the adherend surface to thereby protect it during the working. And another object of the present invention is to provide a method of use thereof.

SUMMARY OF THE INVENTION

The pressure sensitive adhesive sheet of the present invention comprises a substrate and, superimposed thereon, a pressure sensitive adhesive layer, this substrate exhibiting a maximum value of dynamic viscoelasticity tan δ of at least 0.5 at a temperature ranging from −5 to 80° C.

It is preferred that the above substrate have a thickness and Young's modulus whose product is in the range of 0.5 to 100 kg/cm.

The present invention is also concerned with a method of use of the above pressure sensitive adhesive sheet comprising sticking the pressure sensitive adhesive sheet to a surface of an adherend and working the adherend at its back while protecting the adherend surface by means of the pressure sensitive adhesive sheet.

This invention provides a surface protective pressure sensitive adhesive sheet which can precisely follow the irregularities of an adherend surface to thereby absorb the irregular height differences and which, at the time of grinding of the back of the adherend, enables accomplishing a smooth back grinding without being affected by the irregularities of the adherend surface.

DETAILED DESCRIPTION OF THE INVENTION

The present invention will be described in detail below.

The pressure sensitive adhesive sheet of the present invention comprises a substrate and, superimposed thereon, a pressure sensitive adhesive layer.

The substrate exhibits a maximum value of dynamic viscoelasticity tan δ (hereinafter simply referred to as "tan δ value") of at least 0.5, preferably 0.5 to 2.0, and still preferably 0.7 to 1.8 at a temperature ranging from −5 to 80° C. The terminology "tan δ" used herein means the loss tangent which defines the ratio of loss elastic modulus/ storage elastic modulus. It is measured by the use of a dynamic viscoelasticity measuring instrument on the basis of response to a stress such as tension or torsion applied to an object.

In the present invention, it is preferred that the above substrate have a thickness and Young's modulus whose product is in the range of 0.5 to 100 kg/cm, especially 1.0 to 50 kg/cm, and still especially 2.0 to 40 kg/cm. The thickness of the substrate is preferably in the range of 30 to 1000 µm, still preferably 50 to 800 µm, and optimally 80 to 500 µm.

The substrate is composed of a resin film, the type of which is not particularly limited as long as the above properties are exhibited. The above properties may be exhibited by either the resin per se or the resin blended with additives. The substrate may be prepared by either conducting film formation by a curable resin and curing the film or conducting film formation by a thermoplastic resin.

For example, a photocurable resin or a thermosetting resin is used as the curable resin. Preferred is a photocurable resin.

The photocurable resin is preferably selected from among, for example, resin compositions whose principal component is a hotopolymerizable urethane acrylate oligomer and polyenethiol resins.

This urethane acrylate oligomer can be obtained by reacting an isocyanate-terminated urethane prepolymer which is obtained by reacting a polyester or polyether type polyol compound with a polyisocyanate compound such as 2,4-tolylene diisocyanate, 2,6-tolylene diisocyanate, 1,3-xylylene diisocyanate, 1,4-xylylene diisocyanate or diphenylmethane-4,4'-diisocyanate with an acrylate or methacrylate having hydroxyl group such as 2-hydroxyethyl acrylate, 2-hydroxyethyl methacrylate, 2-hydroxypropyl acrylate, 2-hydroxypropyl methacrylate, polyethylene glycol acrylate or polyethylene glycol methacrylate. This urethane acrylate oligomer has a photopolymerizable double bond in its molecule and undergoes polymerization and curing when irradiated with light to thereby form a film.

The molecular weight of urethane acrylate oligomers preferably used in the present invention is in the range of 1000 to 50,000, especially 2000 to 30,000. These urethane acrylate oligomers can be used either individually or in combination.

It is often difficult to obtain a film only from the above urethane acrylate oligomer. Thus, films are generally obtained by diluting the urethane acrylate oligomer with a photopolymerizable monomer, conducting a film formation and curing the film. The photopolymerizable monomer has a photopolymerizable double bond in its molecule, and, in the present invention, preferred is an acrylic ester compound having a relatively bulky group.

The photopolymerizable monomer employed for diluting the urethane acrylate oligomer is, for example, selected from among:

alicyclic compounds such as isobornyl (meth)acrylat dicyclopentenyl (meth)acrylate dicyclopentanyl (meth)acrylate dicyclopentenyloxy (meth)acrylate, cyclohexyl (meth)acrylate and adamantane (meth)acrylate;

aromatic compounds such as benzyl acrylate; and heterocyclic compounds such as tetrahydrofurfuryl (meth)acrylate, morpholinyl acrylate, N-vinylpyrrolidone and N-vinylcaprolactam. According to necessity, polyfunctional (meth)acrylates may be used.

The above photopolymerizable monomer is preferably added in an amount of 5 to 900 parts by weight, still preferably 10 to 500 parts by weight, and optimally 30 to 200 parts by weight to 100 parts by weight of the urethane acrylate oligomer.

On the other hand, the polyene-thiol resin for use in the production of the substrate is formed from a polyene compound having no acryloyl group and a polythiol compound. Specifically, the polyene compound is selected from among, for example, diacrolein pentaerythritol, trimethylolpropane diallyl ether adduct of tolylene diisocyanate and unsaturated allylurethane oligomer. Mercaptoacetic acid or mercaptopropionic acid ester of pentaerythritol can preferably be used as the polythiol compound. Furthermore, commercially available polyene polythiol oligomers can be used. The molecular weight of the polyene-thiol resin for use in the present invention is preferably in the range of 3000 to 50,000, still preferably 5000 to 30,000.

In the forming of the substrate from the photocurable resin, the time spent by polymerization and curing effected by photoirradiation and the photoirradiation dose can be reduced by mixing a photopolymerization initiator into the resin.

This photopolymerization initiator can be a photoinitiator such as a benzoin compound, an acetophenone compound, an acylphosphine oxide compound, a titanocene compound, a thioxanthone compound or a peroxide compound or a photosensitizer such as an amine or a quinone. Specific examples thereof include 1-hydroxycyclohexyl phenyl ketone, benzoin, benzoin methyl ether, benzoin ethyl ether, benzoin isopropyl ether, benzyl diphenyl sulfide, tetramethylthiuram monosulfide, azobisisobutyronitrile, dibenzyl, diacetyl and β-chloroanthraquinone.

The photopolymerization initiator is preferably added in an amount of 0.05 to 15 parts by weight, still preferably 0.1 to 10 parts by weight, and optimally 0.5 to 5 parts by weight to 100 parts by weight of the resin total.

In the production of the above curable resin, oligomer and monomer can be selected from among various combinations so that the above properties can be realized.

The thermoplastic resin for use in the substrate can be selected from among, for example, polyolefin resins such as polyethylene, polypropylene, polybutene, polybutadiene, polymethylpentene, polyvinyl chloride, polyvinylidene chloride, nonhydrogenated styrene-vinylisoprene block copolymer and hydrogenated thereof. Of these, nonhydrogenated or hydrogenated styrene-vinylisoprene block copolymer is preferred.

The styrene-vinylisoprene block copolymer is generally an SIS (styrene-isoprene-styrene block copolymer) having a high content vinyl group. Both the nonhydrogenated and the hydrogenated styrene-vinylisoprene block copolymer per se exhibit a high peak of tan δ at about room temperature.

Additives capable of enhancing the tan δ value are preferably added to the above resin. Examples of the additives capable of enhancing the tan δ value include inorganic fillers such as calcium carbonate, silica and mica and metal fillers such as iron and lead. Especially, the addition of metal fillers having a high specific gravity is effective.

Further, the substrate may contain other additives, for example, plasticizers or colorants such as pigments and dyes in addition to the above components.

With respect to the film forming method, for example, the substrate can be produced by first casting a liquid resin (for example, noncured resin or resin solution) onto a processing sheet in the form of a thin film and subsequently conducting given steps for film formation by means of appropriate way corresponding to resin type. In this method, the stress upon the resin during the film formation is slight, so that the occurrence of fish-eye (insoluble portion of the resin components) is slight. Moreover, the uniformity of the film thickness is high and the thickness precision generally falls within 2%.

Another preferred method of forming a film comprises calendering or extrusion forming with the use of T die or tubular film method.

Corona treatment or superimposition of another layer such as primer may be effected on an upper surface, namely the side furnished with the pressure sensitive adhesive layer, of the substrate in order to enhance the adherence to the pressure sensitive adhesive layer between the substrates.

The pressure sensitive adhesive sheet of the present invention is produced by superimposing the pressure sensitive adhesive layer on the above substrate. When the pressure sensitive adhesive layer is composed of an ultraviolet curable pressure sensitive adhesive, a transparent substrate is used.

The pressure sensitive adhesive layer can be formed from various conventional pressure sensitive adhesives. These pressure sensitive adhesives are not limited and, for example, any of rubber, acrylic, silicone and polyvinyl ether based pressure sensitive adhesives can be used. Further, radiation curable, thermally foaming and water swellable pressure sensitive adhesives can be used.

Although depending on the type of employed material, the thickness of the pressure sensitive adhesive layer is generally in the range of about 3 to 100 μm, preferably about 10 to 50 μm.

Various pressure sensitive adhesives can be used as the above pressure sensitive adhesive without any particular limitation. Those described in, for example, Japanese Patent Publication No. 1(1989)-56112 and Japanese Patent Laid-open Publication No. 7(1995)-135189 are preferably used as the radiation curable (light curable, ultraviolet curable or electron beam curable) pressure sensitive adhesive, which, however, is not limited thereto. In the present invention, it is especially preferred to employ ultraviolet curable pressure sensitive adhesives. Moreover, those described in, for example, Japanese Patent Publication No. 5(1993)-77284 and Japanese Patent Publication No. 6(1994)-101455 are preferably used as the water swellable pressure sensitive adhesive.

The pressure sensitive adhesive sheet of the present invention can be obtained by coating a variable substrate in appropriate thickness with the above pressure sensitive adhesive according to the customary technique employing a knife roll coater, a gravure coater, a die coater, a reverse coater or the like and drying the pressure sensitive adhesive to thereby form a pressure sensitive adhesive layer on the substrate. When considered necessary, a release liner is applied onto the pressure sensitive adhesive layer.

The pressure sensitive adhesive sheet of the present invention is used to protect the surface of various items and to effect temporary fixing at the time of precision working. In particular, the pressure sensitive adhesive sheet is suitably used as one for protecting the circuit surface during the grinding of the back of semiconductor wafers. The pressure sensitive adhesive sheet of the present invention is furnished with the substrate possessing the above specified properties and hence effectively absorbs the irregularities of the circuit surface. Therefore, the pressure sensitive adhesive sheet of the present invention can not only be stuck with satisfactory adherence to wafers provided with bumps and the like and thus having large surface irregular height differences but also mitigate the influence of the irregularities of the wafer surface on the back grinding to thereby enable not only prevention of the wafer breakage but also attaining an extremely smooth grinding. Moreover, when the pressure sensitive adhesive layer is composed of, for example, the ultraviolet curable pressure sensitive adhesive, the adhesive strength can be easily reduced by ultraviolet irradiation, so that, after the completion of required working, the pressure sensitive adhesive layer can be easily stripped off by irradiating the pressure sensitive adhesive layer with ultraviolet rays.

This invention provides a surface protective pressure sensitive adhesive sheet which can precisely follow the irregularities of an adherend surface to thereby absorb the irregular height differences and which, at the time of grinding of the back of the adherend, enables accomplishing a smooth back grinding without being affected by the irregularities of the adherend surface.

EXAMPLE

The present invention will further be illustrated below with reference to the following Examples which in no way limit the scope of the invention.

In the following Examples and Comparative Examples, the "back grinding aptitude test" was carried out in the following manner.

Back Grinding Aptitude Test

The following dotted bad marks by printing as bumps were provided on a specular surface of 6-inch semiconductor wafer. Each pressure sensitive adhesive sheet was stuck to the surface of the wafer on which the bad marks were provided, and the opposite surface of the wafer was ground. The wafer configuration, grinding conditions and evaluation method were as follows:

(1) Wafer configuration thickness of wafer (thickness of portion where no dot was printed): 650 to 700 μm, dot diameter: 500 to 600 μm, dot height: 70 μm, and dot pitch: 10 mm interval (overall printing);

(2) Back grinding conditions finished thickness: 200 μm, and grinding apparatus: grinder DFG 840 manufactured by Disco Corporation; and (3) Evaluation method Ground wafer back was observed. When there was no crack or dimple or when dimples were observed but the maximum depth thereof was less than 2 μm, the wafer was evaluated as "good". On the other hand, when dimples were observed and the maximum depth thereof was 2 μm or more, the wafer was evaluated as "dimpled".

The tan δ was measured by a dynamic viscoelasticity measuring instrument at a 110 Hz tensile stress. Specifically, each substrate was sampled into a predetermined size, and the tan δ was measured at a frequency of 110 Hz and at temperature ranging from −40 to 150° C. with the use of Rheovibron DDV-11-EP manufactured by Orientec Corporation. The maximum value of measured tan δ at temperature ranging from −5 to 80° C. was employed as "tan δ value".

The Young's modulus was measured at a test speed of 200 mm/min in accordance with Japanese Industrial Standard K7127.

Example 1

50 parts by weight of urethane acrylate oligomer having a weight average molecular weight of 5000 (produced by Arakawa Chemical Industry Co., Ltd.), 50 parts by weight of isobornyl acrylate, 2.0 parts by weight of photopolymerization initiator (Irgacure 184 produced by Ciba-Geigy, Limited) and 0.2 part by weight of phthalocyanine pigment were blended together, thereby obtaining a photocurable resin composition.

Polyethylene terephthalate (PET) film (produced by Toray Industries, Inc., thickness: 38 μm) as a casting processing sheet was coated with the above resin composition at a thickness of 110 Am according to the fountain die technique, thereby forming a resin composition layer. Immediately after the coating, the resin composition layer was laminated with the same PET film and thereafter irradiated with ultraviolet rays emitted from a high pressure mercury lamp (160 W/cm, distance 10 cm) at a dose of 250 mJ/cm$^2$ so that the resin composition layer was crosslinked and cured. Thus, a substrate film of 110 μm thickness was obtained after peeling both the PET films. The tan δ and Young's modulus of this substrate film were measured by the above methods. The results are given in Table 1.

One side of this substrate film was coated with a pressure sensitive adhesive composition prepared by blending together 100 parts by weight of acrylic pressure sensitive adhesive (copolymer of n-butyl acrylate and acrylic acid), 120 parts by weight of urethnyate oligomer whose molecular weight was 8000, 10 parts by weight of curing agent (diisocyanate type compound) and 5 parts by weight of photopolymerization initiator (benzophenone type compound), and dried so that a pressure sensitive adhesive layer of 20 μm thickness was formed. Thus, a pressure sensitive adhesive sheet was obtained.

The back grinding aptitude test of the obtained pressure sensitive adhesive sheet was conducted. The results are given in Table 1.

Example 2

The same procedure as in Example 1 was repeated except that morpholinyl acrylate was used in place of isobornyl acrylate. The results are given in Table 1.

Example 3

The same procedure as in Example 1 was repeated except that a mixture of 25 parts by weight of isobornyl acrylate and 25 parts by weight of morpholinyl acrylate was used in place of 50 parts by weight of isobornyl acrylate. The results are given in Table 1.

Example 4

A 60% toluene solution of styrene-vinylisoprene block copolymer (Hybrar VS-1 produced by Kuraray Co., Ltd.) was cast on the same support film as in Example 1, and dried at 100° C. for 2 minutes without lamination and, ultraviolet irradiation. Thus, a 300 μm thick substrate film having the tan δ value and Young's modulus listed in Table 1 was obtained.

A pressure sensitive adhesive sheet was prepared from the obtained substrate film in the same manner as in Example 1. The back grinding aptitude test of the obtained pressure sensitive adhesive sheet was conducted. The results are given in Table 1.

Example 5

In place of the photocurable resin composition of Example 1, polyene-thiol resin (BY-314 produced by Asahi Denka Kogyo K. K.) was formed into a film and cured in the same manner as in Example 1, thereby obtaining a substrate film of 250 μm thickness. The tan δ and Young's modulus of this substrate film were measured by the above methods. The results are given in Table 1. A pressure sensitive adhesive sheet was prepared from the obtained substrate film in the same manner as in Example 1. The back grinding aptitude test of this pressure sensitive adhesive sheet was conducted. The results are given in Table 1.

Example 6

The same procedure as in Example 1 was repeated except that the amount of added urethane acrylate oligomer (produced by Arakawa Chemical Industry Co., Ltd.) was changed to 60 parts by weight and 50 parts by weight of N-vinylcaprolactam was used in place of 50 parts by weight of isobornyl acrylate. The results are given in Table 1.

Comparative Example 1

The same procedure as in Example 1 was repeated except that 110 μm thick low-density polyethylene film (trade name: Sumikathene L705) was used as the substrate film. The results are given in Table 1.

Comparative Example 2

The same procedure as in Example 1 was repeated except that a 100 μm thick film of ethylene/vinyl acetate copolymer (vinyl acetate content: 12% by weight) was used as the substrate film. The results are given in Table 1.

Comparative Example 3

The same procedure as in Example 1 was repeated except that a 110 μm thick film of ethylene/methyl methacrylate copolymer (methyl methacrylate content: 6% by weight) was used as the substrate film. The results are given in Table 1.

Comparative Example 4

The same procedure as in Example 1 was repeated except that a 110 μm thick film of ethylene/methacrylic acid copolymer (methacrylic acid content: 8% by weight) was used as the substrate film. The results are given in Table 1.

Comparative Example 5

The same procedure as in Example 1 was repeated except that a 100 μm polyethylene terephthalate film was used as the substrate film. The results are given in Table 1.

TABLE 1

|  | Max. value of tan δ (−5 to 80° C.) | Young's modulus (kg/cm$^2$) | Film thickness (μm) | [FT] × [YM] (kg/cm) | Back grinding aptitude |
|---|---|---|---|---|---|
| Example 1 | 0.78 | 1100 | 110 | 12.1 | good |
| 2 | 0.85 | 2400 | 110 | 26.4 | good |
| 3 | 1.18 | 1400 | 110 | 15.4 | good |
| 4 | 1.05 | 100 | 300 | 3.0 | good |
| 5 | 1.61 | 120 | 250 | 3.0 | good |
| 6 | 0.81 | 3000 | 110 | 33.0 | good |
| Comp. Ex. 1 | 0.19 | 1300 | 110 | 14.3 | dimpled, wafer broken |
| 2 | 0.16 | 660 | 100 | 6.6 | dimpled, wafer broken |
| 3 | 0.21 | 900 | 110 | 9.9 | dimpled |
| 4 | 0.17 | 1300 | 80 | 10.4 | dimpled, wafer broken |
| 5 | 0.03 | 35000 | 100 | 350.0 | dimpled, wafer broken |

Note
[FT] × [YM] means [film thickness] × [Young's modulus].

What is claimed is:

1. A method of using a pressure sensitive adhesive sheet comprising sticking the pressure sensitive adhesive sheet to a surface of an adherend that has a surface having a height difference of at least 30 μm and working the adherend at its back while protecting the adherend surface by means of the pressure sensitive adhesive sheet, wherein the pressure sensitive adhesive sheet comprises a substrate and, superimposed thereon, a pressure sensitive adhesive layer, said substrate exhibiting a maximum value of dynamic viscoelasticity tan δ of 0.78 to 1.61 at a temperature ranging from −5 to 80° C.

2. A method of using a pressure sensitive adhesive sheet comprising sticking the pressure sensitive adhesive sheet to a surface of an adherend that has a surface having a height difference of at least 30 μm and working the adherend at its back while protecting the adherend surface by means of the pressure sensitive adhesive sheet, wherein the pressure sensitive adhesive sheet comprises a substrate and, superimposed thereon, a pressure sensitive adhesive layer, said substrate having a thickness and Young's modulus whose product is in the range of 0.5 to 100 kg/cm and said substrate exhibiting a maximum value of dynamic viscoelasticity tan δ of 0.78 to 1.61 at a temperature ranging from −5 to 80° C.

3. A method of using a pressure sensitive adhesive sheet comprising sticking the pressure sensitive adhesive sheet to a surface of a semiconductor wafer which has a surface having a height difference of at least 30 μm and working the semiconductor wafer surface by grinding the back of the semiconductor wafer while protecting the semiconductor wafer surface by means of the pressure sensitive adhesive sheet, wherein the pressure sensitive adhesive sheet comprises a substrate and, superimposed thereon, a pressure sensitive adhesive layer, said substrate exhibiting a maximum value of dynamic viscoelasticity tan δ of 0.78 to 1.61 at a temperature ranging from −5 to 80° C.

4. A method of using a pressure sensitive adhesive sheet comprising sticking the pressure sensitive adhesive sheet to a surface of a semiconductor wafer which has a surface having a height difference of at least 30 µm and working the semiconductor wafer surface by grinding the back of the semiconductor wafer while protecting the semiconductor wafer surface by means of the pressure sensitive adhesive sheet, wherein the pressure sensitive adhesive sheet comprises a substrate and, superimposed thereon, a pressure sensitive adhesive layer, said substrate having a thickness and Young's modulus whose product is in the range of 0.5 to 100 kg/cm and said substrate exhibiting a maximum value of dynamic viscoelasticity tan δ of 0.78 to 1.61 at a temperature ranging from −5 to 80° C.

* * * * *